US006483705B2

(12) United States Patent
Snyder et al.

(10) Patent No.: US 6,483,705 B2
(45) Date of Patent: Nov. 19, 2002

(54) ELECTRONIC MODULE INCLUDING A COOLING SUBSTRATE AND RELATED METHODS

(75) Inventors: Steven Robert Snyder, Indian Harbour Beach, FL (US); Charles Michael Newton, Palm Bay, FL (US); Michael Ray Lange, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 9 days.

(21) Appl. No.: 09/811,827

(22) Filed: Mar. 19, 2001

(65) Prior Publication Data

US 2002/0131237 A1 Sep. 19, 2002

(51) Int. Cl.$^7$ ................................................. H05K 7/20
(52) U.S. Cl. ....................... 361/709; 361/700; 174/15.1; 165/104.33
(58) Field of Search ................................. 361/687, 689, 361/704, 707, 709, 699, 700; 174/15.1, 15.2, 252; 257/707–727; 165/80.2, 80.3, 46, 104.33, 106.26, 104.34, 126, 133, 911

(56) References Cited

U.S. PATENT DOCUMENTS

| | | | | |
|---|---|---|---|---|
| 4,019,098 A | * | 4/1977 | McCready et al. | 361/385 |
| 4,327,399 A | * | 4/1982 | Sasaki et al. | 361/385 |
| 4,519,447 A | | 5/1985 | Wiech et al. | 165/104.33 |
| 4,727,455 A | * | 2/1988 | Neidig et al. | 361/385 |
| 4,833,567 A | | 5/1989 | Saaski et al. | 361/385 |
| 4,880,053 A | * | 11/1989 | Sheyman | 165/104.26 |
| 5,199,165 A | * | 4/1993 | Crawford et al. | 29/846 |
| 5,216,580 A | | 6/1993 | Davidson et al. | 361/385 |
| 5,769,154 A | * | 6/1998 | Adkins et al. | 165/104.26 |
| 6,056,044 A | * | 5/2000 | Benson et al. | 165/104.26 |

FOREIGN PATENT DOCUMENTS

| | | | | |
|---|---|---|---|---|
| JP | 359119186 A | * | 7/1984 | ........... F28D/15/00 |
| JP | 411148787 A | * | 6/1999 | ........... F28D/15/02 |
| JP | 02000269676 A | * | 9/2000 | ............. H05K/7/20 |
| JP | 02001217365 A | * | 8/2001 | ......... H01L/23/427 |

OTHER PUBLICATIONS

Article "Flat Type Heat Pipe", IBM Technical Disclosure Bulletin, Aug. 1975, vol. 18, Issue 3, pp. 675–676.*
*Embedded Micro Heat Pipes for Microelectronic Packaging of High Power Density Devices*, Harris Corporation, Jul. 12, 1999.

* cited by examiner

Primary Examiner—Darren Schuberg
Assistant Examiner—Michael Datskovsky
(74) Attorney, Agent, or Firm—Allen, Dyer, Doppelt, Milbrath & Gilchrist, P.A.

(57) ABSTRACT

An electronic module includes a cooling substrate, an electronic device mounted thereon, and a heat sink adjacent the cooling substrate. More particularly, the cooling substrate may have an evaporator chamber adjacent the electronic device, at least one condenser chamber adjacent the heat sink, and at least one cooling fluid passageway connecting the evaporator chamber in fluid communication with the at least one condenser chamber. Furthermore, an evaporator thermal transfer body may be connected in thermal communication between the evaporator chamber and the electronic device. Additionally, at least one condenser thermal transfer body may be connected in thermal communication between the at least one condenser chamber and the heat sink. The evaporator thermal transfer body and the at least one condenser thermal transfer body preferably each have a higher thermal conductivity than adjacent cooling substrate portions.

47 Claims, 5 Drawing Sheets

ELECTRONIC MODULE INCLUDING A COOLING SUBSTRATE AND RELATED METHODS

FIELD OF THE INVENTION

The present invention relates to the field of electronic modules, and, more particularly, to electronic modules including a substrate for cooling one or more electronic devices and associated methods.

BACKGROUND OF THE INVENTION

Electronic devices are widely used in many types of electronic equipment. One electronic device is the integrated circuit which may include a silicon or gallium arsenide substrate and a number of active devices, such as transistors, etc. formed in an upper surface of the substrate. It is also typically required to support one or more such integrated circuits in a package that provides protection and permits external electrical connection.

As the density of active devices on typical integrated circuits has increased, dissipation of the heat generated has become increasingly more important. In particular, a relatively large amount of heat may be generated in multi-chip modules (MCMs), microwave transmitters, and photonic devices, for example.

One device which has been used in a variety of applications, including electronic circuit modules, to provide high thermal transport over long distances is the so-called "heat pipe." A heat pipe is a sealed system that includes an evaporator, a condenser, an adiabatic region connecting the evaporator and condenser for liquid and vapor transport, and a capillary or wick for circulating cooling fluid therein. Heat pipes enjoy an advantage over other forms of heat regulating devices in that they can transfer heat without the need for a mechanical pump, compressor or electronic controls, which may provide space savings in certain instances.

An example of an MCM which uses a heat pipe is disclosed in U.S. Pat. No. 5,216,580 to Davidson et al. entitled "Optimized Integral Heat Pipe and Electronic Module Arrangement." This MCM includes electronic circuit components mounted on one side thereof and a thermal wick mounted on another side. A heat pipe evaporator and condenser assembly is attached to the MCM and wick assembly. Furthermore, a suitable working fluid is introduced into the heat pipe assembly which is then hermetically sealed.

Of course, cooling devices generally need to be on the same size scale as the electronic devices they are intended to cool. Yet, the benefits associated with heat pipes are subject to scaling limitations. That is, ever increasing packaging densities, which put high power devices in close proximity with conventional circuitry, may require that larger amounts of heat be transferred more quickly than is possible using conventional heat pipe assemblies not having a pump.

SUMMARY OF THE INVENTION

In view of the foregoing background, it is therefore an object of the invention to provide an electronic module and related methods which provides adequate cooling of one or more electronic devices and has relatively small dimensions.

This and other objects, features, and advantages in accordance with the present invention are provided by an electronic module including a cooling substrate, an electronic device mounted on the cooling substrate, and a heat sink adjacent the cooling substrate. The cooling substrate may include an evaporator chamber adjacent the electronic device, at least one condenser chamber adjacent the heat sink, and at least one cooling fluid passageway connecting the evaporator chamber in fluid communication with the at least one condenser chamber.

More particularly, the electronic module may include an evaporator thermal transfer body connected in thermal communication between the evaporator chamber and the electronic device. Additionally, at least one condenser thermal transfer body may also be connected in thermal communication between the at least one condenser chamber and the heat sink. The evaporator thermal transfer body and the at least one condenser thermal transfer body preferably have a higher thermal conductivity than adjacent cooling substrate portions. The thermal conductivities of the evaporator thermal transfer body and the at least one condenser thermal transfer body may be greater than about 100 Watts per meter-degree Celsius, for example. As such, the evaporator thermal transfer body, the at least one condenser thermal transfer body, and the at least one cooling fluid passageway may cause fluid flow during operation of the electronic module without a pump.

The evaporator thermal transfer body may include a wicking portion exposed within the evaporator chamber for facilitating cooling fluid flow by capillary action. Further, the wicking portion may include a plurality of projections, and the projections may be arranged in a generally rectangular pattern. Additionally, the evaporator thermal transfer body may further include a base plate carrying the wicking portion for facilitating sealing with adjacent cooling substrate portions. The fluid wicking portion may reduce the effects of pool boiling and extend an upper power density limit of the electronic device.

Furthermore, the at least one condenser thermal transfer body may include at least one wicking portion exposed within the at least one condenser chamber for facilitating cooling fluid flow by capillary action. The at least one condenser thermal transfer body may include a reservoir portion adjacent the at least one wicking portion defining a cooling fluid reservoir. Also, the at least one wicking portion may include at least one base and a plurality of projections extending outwardly therefrom.

The plurality of projections of the at least one condenser thermal transfer body may be arranged in two generally rectangular groups oriented at a substantially right angle. In addition, each of the projections may include a reduced width tip portion. The at least one condenser thermal transfer body may further include a base plate carrying the at least one wicking portion for facilitating sealing with adjacent cooling substrate portions. The at least one condenser thermal transfer body thus promotes clearing of condensate from a condensing surface thereof to provide substantially unimpeded condensation.

Additionally, the cooling substrate may further include projections extending inwardly into the at least one cooling fluid passageway for facilitating cooling fluid flow by capillary action. Likewise, the cooling substrate may include projections extending inwardly into the evaporator chamber and the at least one condenser chamber for facilitating cooling fluid flow by capillary action. More specifically, each of the evaporator and the at least one condenser thermal transfer bodies may include at least one of a copper-graphite composite, AlSiC, and metal, and the cooling substrate may include ceramic. The evaporator and the at least one condenser thermal transfer bodies are preferably resistant to corrosion from the cooling fluid.

A method aspect of the invention is for making an electronic module including forming a cooling substrate having an evaporator chamber, at least one condenser chamber, and at least one cooling fluid passageway connecting the evaporator chamber in fluid communication with the at least one condenser chamber. An electronic device is mounted on the cooling substrate adjacent the evaporator chamber. Further, an evaporator thermal transfer body is connected in thermal communication between the evaporator chamber and the electronic device. The evaporator thermal transfer body preferably has a higher thermal conductivity than adjacent cooling substrate portions. Also, a heat sink may be connected to the cooling substrate adjacent the at least one condenser chamber.

According to another method aspect of the present invention, a cooling substrate is formed having an evaporator chamber, at least one condenser chamber, and at least one cooling fluid passageway connecting the evaporator chamber in fluid communication with the at least one condenser chamber. An electronic device is mounted on the cooling substrate adjacent the evaporator chamber, and at least one condenser thermal transfer body is connected in thermal communication between the at least one condenser chamber. The at least one condenser thermal transfer body preferably has a higher thermal conductivity than adjacent cooling substrate portions. Also, a heat sink may be connected to the cooling substrate adjacent the at least one condenser chamber.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for greater clarity.

Referring initially to FIGS. 1–8, the electronic module 20 in accordance with the invention is now initially described. The electronic module 20 includes a package 21 surrounding an electronic device 22. The package 21 includes a base or cooling substrate 21a and a lid 21b connected thereto. The lid 21b defines a cavity 33 over the electronic circuit 22 for protection of the electronic circuit and its interfaces (not shown). The lid 21b may be attached by brazing using a seal ring, for example, as will be appreciated by those of skill in the art, though other configurations are also possible. The package 21 may include low temperature co-fired ceramic (LTCC) material, for example. This material offers advantages in terms of ruggedness, and an ability to form recesses and small stable passageways therein, as well as to provide electrical paths therethrough. Of course, other similar materials may be used as well.

Figure 1:
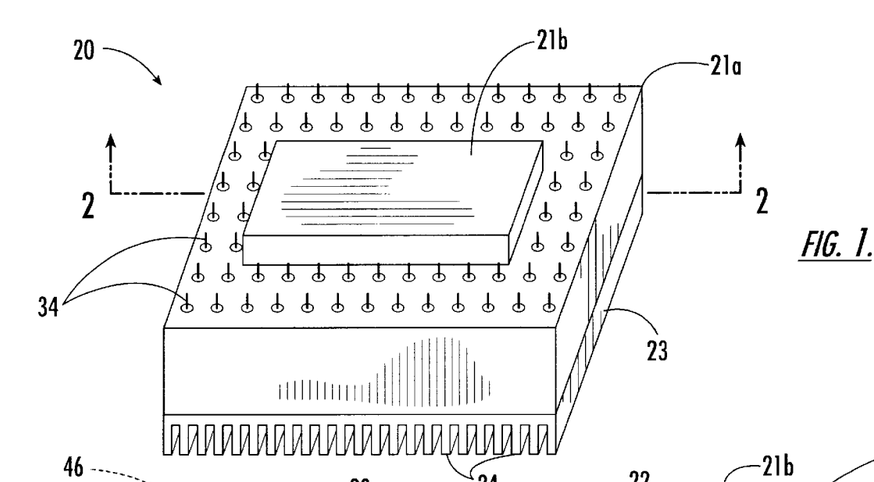
FIG. 1 is a perspective view of an electronic module according to the present invention.

In other embodiments, two or more electronic devices 22 may be carried by the package 21, as will be appreciated by those skilled in the art. The electronic device 22 may include semiconductor devices or integrated circuits, heat coils, resistors, etc., for example. Of course, other electronic devices may also be included in the electronic module 20. The package 21, as best seen in FIG. 1, may carry electrical connectors 34 on at least one of its surfaces. For example, the electrical connectors 34 may be pins in a pin grid array, as illustratively shown. In other embodiments, edge connectors may be provided to connect to a ribbon type cable, for example, as will be appreciated by those skilled in the art.

Figure 2:
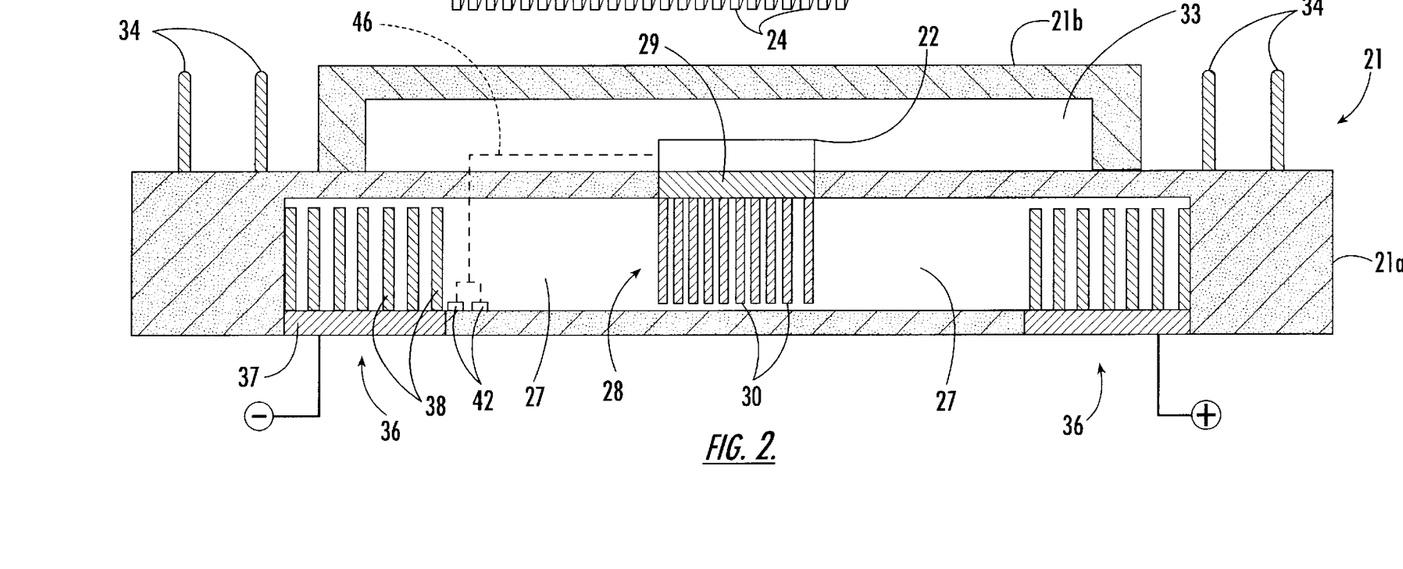
FIG. 2 is a cross-sectional view taken along line 2—2 of FIG. 1.

A heat sink 23 is adjacent the cooling substrate 21a and may include fins 24, for example. Of course, other heat sinks known to those of skill in the art may also be used. For example, the heat sink maybe a rack or metal chassis in which the electronic module is mounted. Further, the heat sink and one or more condenser thermal transfer bodies (described below) may be formed as a single homogenous body. The cooling substrate 21a also has an evaporator chamber 25 adjacent the electronic device 22, at least one condenser chamber 26 adjacent the heat sink 23, and at least one cooling fluid passageway 27 connecting the evaporator chamber in fluid communication with the at least one condenser chamber. The total area of the condenser chambers 26 may be made grater than that of the evaporator chamber 25 to reduce heat flux entering the fins (or heat sink) 24. This may be particularly desirable to do for electronic devices 22 that get so hot that even direct attachment to a heat sink would be insufficient to properly cool the device.

Figure 3:
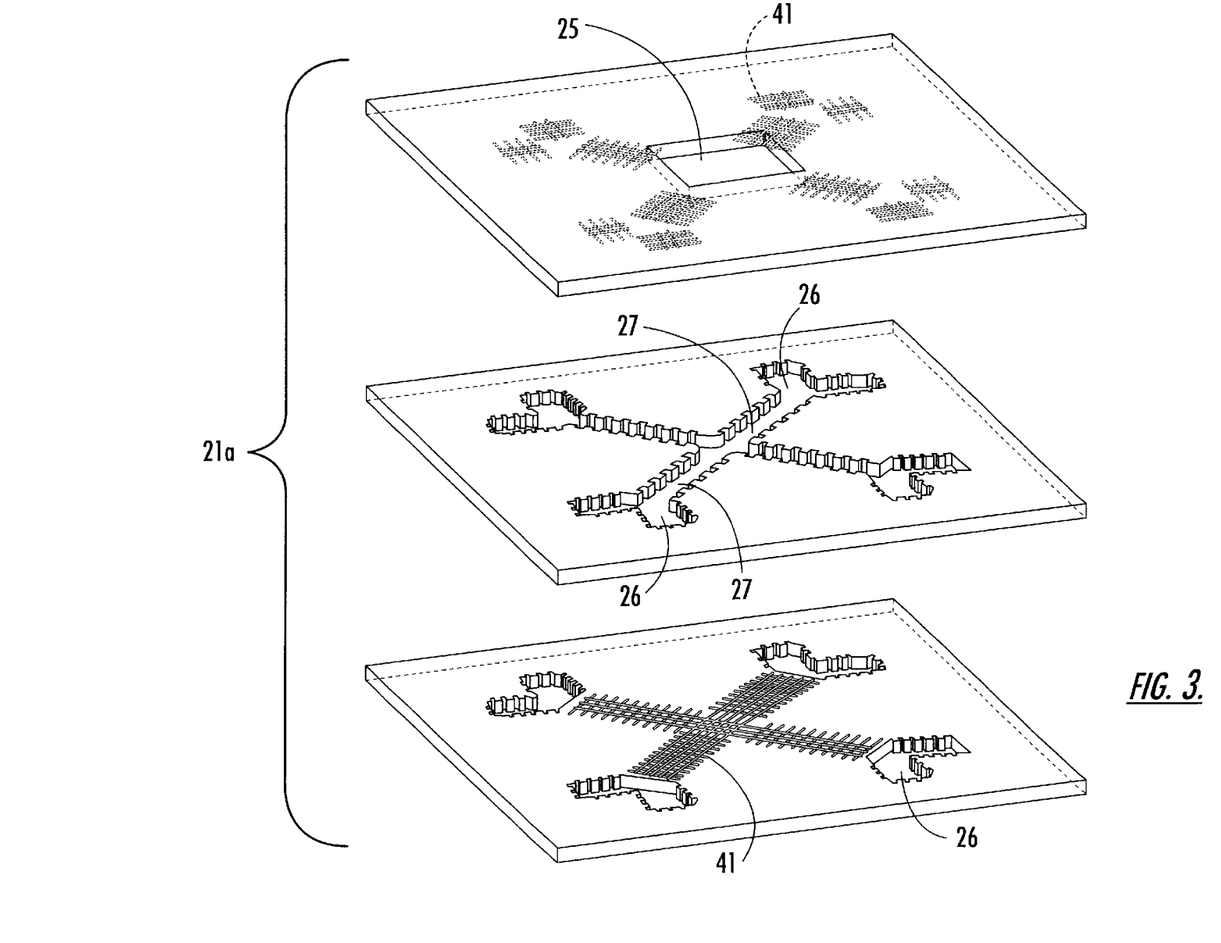
FIG. 3 is an exploded perspective view of a cooling substrate in accordance with the invention.

In the embodiment illustrated in FIG. 3, the cooling substrate 21a includes four condenser chambers 26 and four cooling fluid passageways 27 extending radially outward from the evaporator chamber 25 in a configuration resembling an "X". Of course, those of skill in the art will appreciate that any number of cooling fluid passageways and condenser chambers may be used without departing from the scope of the present invention.

The electronic module 20 further includes an evaporator thermal transfer body 28 connected in thermal communication between the evaporator chamber 25 and the electronic device 22. Furthermore, a condenser thermal transfer body 36 is connected in thermal communication between each condenser chamber 26 and the heat sink 23. Of course, it will appreciated that more than one heat sink 23 may be used in accordance with the invention.

Figure 10:
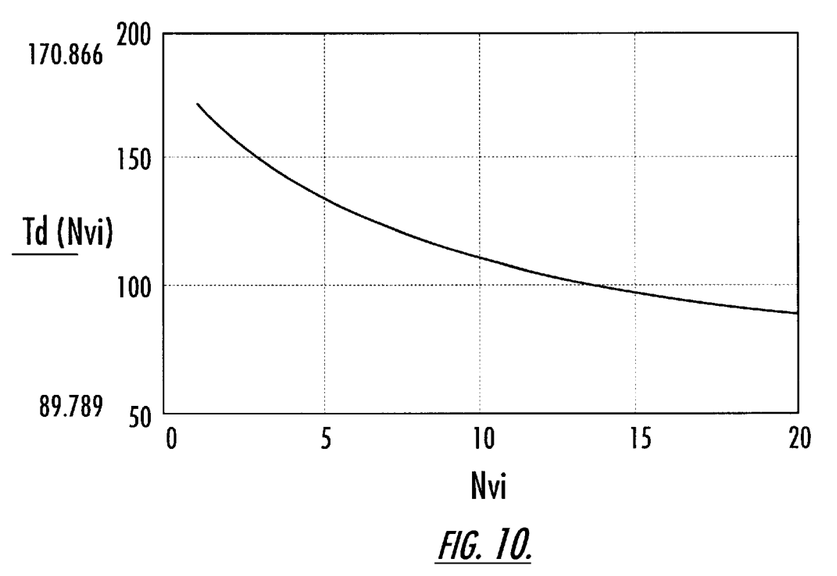
FIG. 10 is a graph of modeled device temperature versus a number of thermal vias used in the electronic module of FIG. 1.
Figure 11:
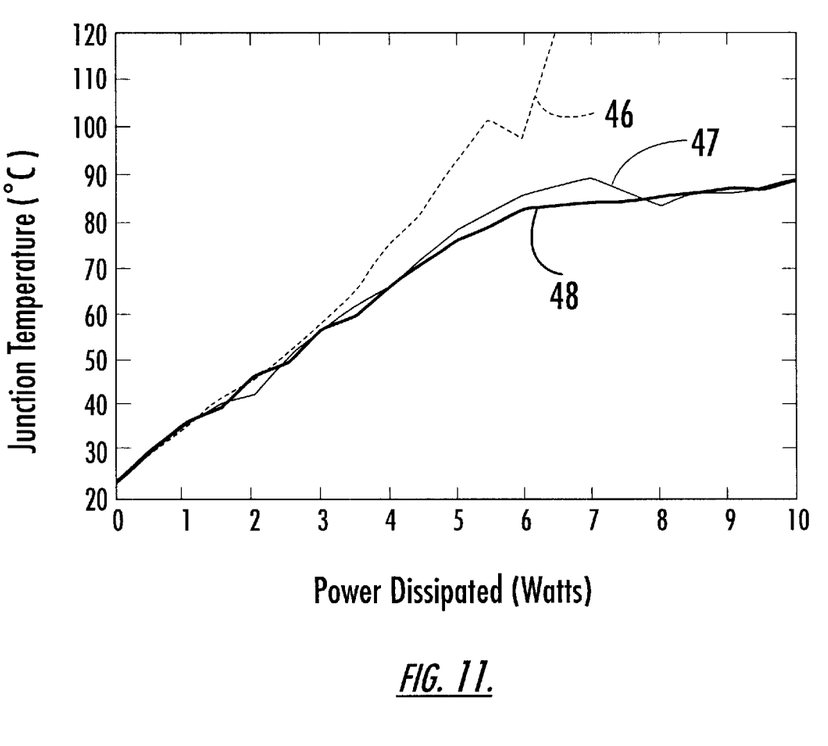
FIG. 11 is a graph of junction temperature versus power dissipated for the electronic module of FIG. 1.

The evaporator thermal transfer body 28 and the condenser thermal transfer bodies 36 each preferably have thermal conductivities greater than about 100 Watts permeter degree Celsius. The thermal transfer bodies 28, 36 may also have a higher thermal conductivity than adjacent portions of the cooling substrate 21*a*. Those skilled in the art will appreciate that the thermal transfer bodies 28, 36 allow a low operating temperature of the electronic device 22 to be maintained, as illustrated in FIG. 10.

By way of example, the evaporator thermal transfer body 28 and the condenser thermal transfer bodies 36 may include at least one of a copper-graphite composite material, AlSiC, and metal. Of course, other suitable materials known to those of skill in the art may also be used, and it is preferred that the material used be resistant to corrosion from the cooling fluid (e.g., at least one of nickel and gold). It is anticipated that both thermal transfer bodies 28, 36 will be used in accordance with the present invention to maximize cooling fluid flow. Yet, it should be understood that both thermal transfer bodies may not be necessary in every application and that one or the other may be used.

As a result, the evaporator thermal transfer body 28, the condenser thermal transfer bodies 36, and the cooling fluid passageways 27 cause cooling fluid flow during operation of the electronic module without a pump. Moreover, the various materials noted above that are used for the cooling substrate 21*a* and the thermal transfer bodies 28, 36 are all reasonably matched in temperature coefficient of expansion (CTE) (a material property) with each other and semiconductor materials. This matching allows for direct mounting of silicon and other electronic devices 22 to the cooling substrate 21*a*. For example, the cooling substrate 21*a* may be an LTCC and the thermal transfer bodies 28, 36 may be a copper-graphite composite material.

Figure 4:
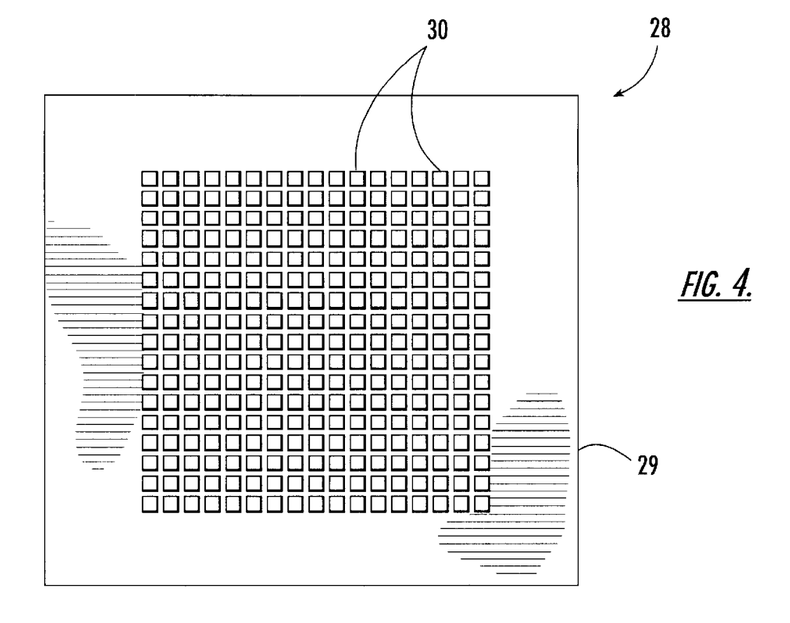
FIG. 4 is a top view of the evaporator thermal transfer body of the electronic module of FIG. 2.
Figure 5:
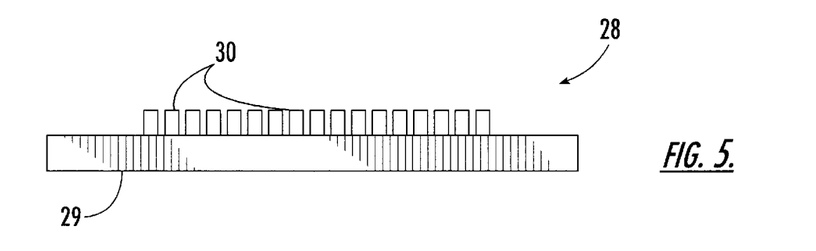
FIG. 5 is a side view of the evaporator thermal transfer body of the electronic module of FIG. 2.

To enhance the cooling fluid flow, the evaporator thermal transfer body 28 includes a wicking portion exposed within the evaporator chamber 25 for facilitating cooling fluid flow by capillary action. The wicking portion includes a plurality of projections extending outwardly from a base plate 29. The plurality of projections 30 may be arranged in a generally rectangular pattern, as shown in FIGS. 4 and 5, although other configurations may also be used. The base plate 29 facilitates sealing with adjacent cooling substrate 21*a* portions, as will be described further below.

Likewise, each condenser thermal transfer body 36 also includes at least one wicking portion exposed within its respective condenser chambers 26 for facilitating cooling fluid flow by capillary action.

Figure 6:
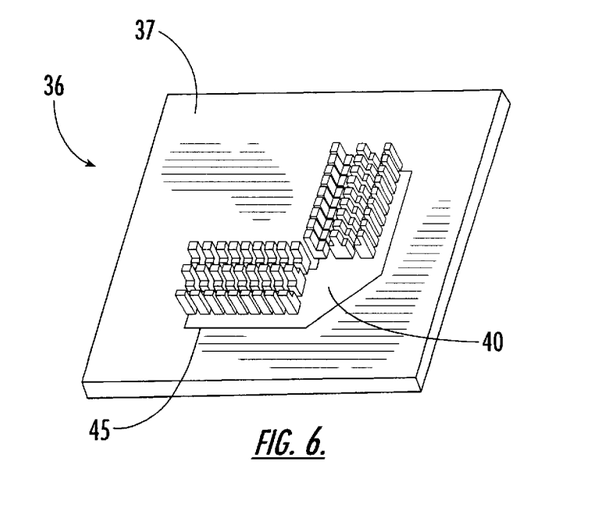
FIG. 6 is a perspective view of the condenser thermal transfer body of the electronic module of FIG. 2.
Figure 7:
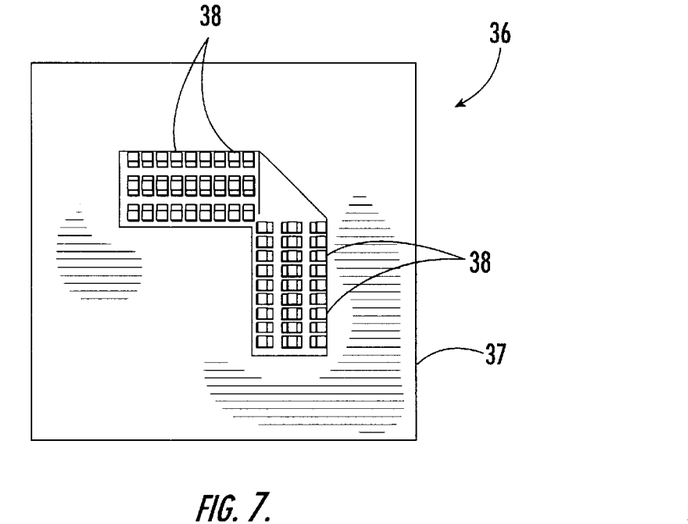
FIG. 7 is a top view of the condenser thermal transfer body of the electronic module of FIG. 2.
Figure 8:
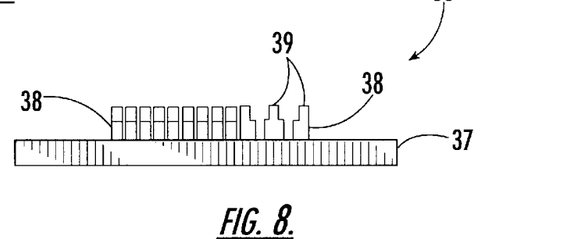
FIG. 8 is a side view of the condenser thermal transfer body of the electronic module of FIG. 2.
Figure 9:
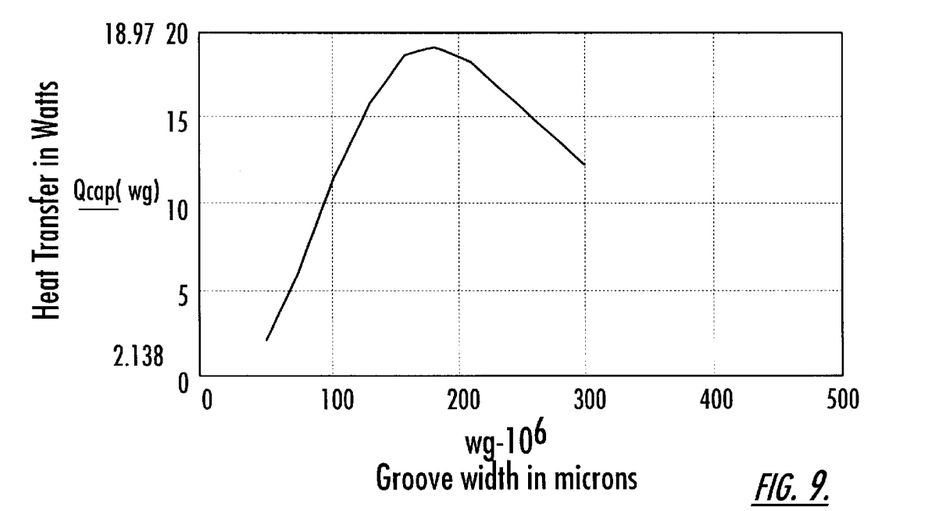
FIG. 9 is a graph of modeled heat transfer capacity versus groove or capillary wick width for the electronic module of FIG. 1.

The wicking portion includes a base 45 and a plurality of projections 38 extending outwardly therefrom. The projections 38 may be arranged in two generally rectangular groups oriented at a substantially right angle, as illustrated in FIGS. 6 and 7. Also, the condenser thermal transfer body 36 may further include a base plate 37 for facilitating sealing with adjacent cooling substrate 21*a* portions, as will be described further below. Each of the projections 38 may include a reduced width tip portion 39 to alleviate capillary flooding by increasing the gap distance therebetween. This facilitates the removal of a thermally impeding fluid layer and thus promotes condensation. The condenser thermal transfer bodies 36 may also include a reservoir portion 40 adjacent the wicking portion defining a cooling fluid reservoir.

Further, to enable cooling fluid flow return to the evaporator chamber 25, the cooling substrate 21*a* may also include projections 41 extending inwardly into the cooling fluid passageways, the evaporator chamber, and the condenser chambers 26 defining respective wicking surfaces for facilitating cooling fluid flow by capillary action. That is, a high flow rate capillary is formed with a high surface energy that provides internal full surface coverage and allows for rapid fluid transport. This alleviates capillary depletion which otherwise may occur on non-wicking surfaces, which may be particularly important in small heat pipe assemblies.

The projections 41 may be created, for example, by forming interconnecting orthogonal grooves on adjacent cooling substrate 21*a* layers on opposing parallel surfaces of the cooling fluid passageways 27 and chambers 25, 26. Processes used to create these structures are based on standard multilayer ceramic fabrication techniques known to those of skill in the art. Of course, those skilled in the art will appreciate that other wicking structures may also be used in accordance with the present invention.

In addition, a plurality of fluid dissociation electrodes may be carried by the cooling substrate 21*a* to control a pressure of the cooling fluid. In one embodiment, any two of the thermal transfer bodies 28, 36 may be used as the fluid dissociation electrodes and may be driven by differing (e.g., positive and negative) DC potentials (see FIG. 2), for example, to cause dissociation of cooling fluid. In an alternative embodiment, fluid dissociation electrodes 42 may be mounted within the cooling substrate 21*a*. By causing cooling fluid to dissociate into its constituent gases, the fluid dissociation electrodes allow the pressure, and thus the flow rate, of the cooling fluid to be controlled. That is, the partial pressure of the dissociated gases are increased, which thereby decreases the partial pressure of the fluid vapor and increases the operating temperature. When the fluid dissociation electrodes are used, the cooling fluid is preferably one that may be dissociated when a current is passed therethrough, for example, water.

In one embodiment, the fluid dissociation electrodes allow dissociation of cooling fluid during the manufacturing process. In another embodiment, the electronic device 22 may drive the fluid dissociation electrodes 42 (or the thermal transfer bodies), for example, by sensing a temperature of the electronic device and driving the electrodes responsive to the sensed temperature, as illustratively shown with a dashed connection line 46 in FIG. 2. Each of the fluid dissociation electrodes 42 may be metal which, again, is preferably resistant to corrosion from the cooling fluid. The electrodes 42 may therefore also include at least one of gold and nickel. Of course, it will be appreciated by those skilled in the art that the fluid dissociation electrodes 42 may be used in a variety of structures other than the cooling substrate disclosed herein.

The electronic module 20 may be fabricated as a multilayer ceramic structure as follows. Unfired (green) ceramic in tape form is processed to cut the required cavities and wick structures. Internal thick film conductors are then printed as required to route the multi-level circuitry. Once the individual layers are complete, they are stacked and laminated to form a green body which is then fired. Singulation of individual structures may then be performed, if necessary, by diamond sawing or other suitable methods. Lapping may be required to remove surface deformations produced during lamination and firing, as will be appreciated by those of skill in the art.

Post-fired thick film conductors are then printed and fired to provide the base plates 29, 37 to provide brazeable, sealing surfaces for the evaporator and condenser thermal transfer bodies 28, 36, respectively. The base material for the thermal transfer bodies 28, 36 (e.g., a copper-graphite composite material) may then be nickel and gold plated for brazing to the LTCC cooling substrate 21a. The brazing process is preferably fluxless to avoid contamination of the wicking surfaces and provides hermetic sealing of the cooling substrate 21a.

Fine leak verification may be used to ensure package integrity, as will be appreciated by those skilled in the art. It may also be necessary to attach the electronic device 22 prior to filling the cooling substrate 21a with cooling fluid to allow for solder die to attach to the thermal transfer bodies 28, 36. Otherwise, a filled, operational heat pipe may inhibit reflow or catastrophically fail if internal vapor pressures become to high. A fill tube, such as a copper tube, may be included in the cooling substrate 21a for evacuation and filling. The filling may be accomplished by injection.

Those of skill in the art will appreciate that numerous advantages are provided according to the present invention. For example, the enhanced capillary flow achieved according to the present invention may allow for miniature cooling fluid channel dimensions believed to be previously unavailable in the prior art. Also, the fluid reservoir 40 and evaporator thermal transfer body 28 incorporating the wicking portion reduces the effect of pool boiling and extends the power density upper limit.

Moreover, the condenser thermal transfer body 36 promotes clearing of the condensate (liquid) from the condensing surface to provide substantially continuous unimpeded condensation. Also, designs including a central or multiple evaporator chambers 25 and one or more condenser chambers 26 interconnected by one or more cooling fluid passageways 27 for the routing of cooling fluid are also provided by the present invention. This enables dense packaging of large heat flux devices and stabilizes the temperature of multiple components at identical temperatures. Additionally, as noted above, the dissociation electrodes 42 allow for gas generation and, consequently, regulation of pressure and operating temperature.

The preceding advantages may be more fully appreciated with reference to the test results provided in the following example of an electronic module fabricated according to the present invention.

EXAMPLE

The design of the electronic module 20 according to the present invention accommodates heat spreading away from the electronic device 22 as well as temperature stable operation, as will be appreciated by those of skill in the art. Spreading is accomplished by increasing the condenser area with respect to that of the evaporator and by dividing and separating the condenser from the evaporator. For example, a test electronic module according to the present invention was constructed to have a total condenser area of about twice that of the evaporator area, although other dimensions may also be used according to the invention.

Each segment of the heat pipe structure defined by the cooling substrate 21a has unique considerations, several of which relate to scaling limitations. The most notable limitation is that such "miniature" heat pipes are more sensitive to vapor-liquid interaction through the adiabatic region than their larger counterparts. Vapor flow can be dramatically restricted if certain characteristic dimensions are not maintained. For the test device described herein, it was determined that a minimum vapor channel cross section of 1.27 mm was required, though smaller dimensions may be possible according to the present invention in other designs, as will be understood by those of skill in the art.

A low partial pressure of any unintended gasses should be maintained to avoid reducing the partial pressure of the vapor formed from the desired cooling fluid. Miniature heat pipes are very sensitive to unintended gasses, and thus hermetic sealing is preferred. Furthermore, the wicking surfaces 41 should provide a fine enough structure to prevent condensation droplets from forming and depleting the cooling fluid supply. Additionally, cooling fluid should come in close contact with the heat sources to enable temperature stable device operation, and condensation surfaces should remain clear of a thermally impeding fluid layer. Moreover, capillary flow should be unimpeded with sufficient capacity, and a condenser-to-evaporator ratio should be sufficiently higher than one. The choice of cooling fluid is also important as it should be free of contaminants, especially dissolved gasses. Water was chosen for the cooling fluid in the test device because of its high latent heat of evaporation, well-understood properties, and ease of degassing by boiling. Of course, other cooling fluids may also be used.

Other design parameters may also need to be taken into account. For example, some of the key geometric parameters include the cross-sectional structure of the cooling fluid passageways 27 and length of the wicking surfaces 41. Others parameters include the evaporator and condenser chamber 25, 26 sizes and structures, which may be driven by empirical results and fabrication issues, as will be understood by those of skill in the art. These parameters drive the size of the device required to provide a given heat dissipation capacity for a given type and number of electronic devices 22. Further discussion of such design parameters with respect to the present invention may be found in a paper entitled "Miniature Embedded Heat Pipes in Low Temperature Co-Fired Ceramic for Electronic Devices Requiring Temperature Stability," by the applicants of the present invention which was presented at the Society of Automotive Engineers Aerospace Power Systems Meeting on Nov. 1, 2000, in San Diego, Calif., which is hereby incorporated herein in its entirety by reference.

Generally speaking, the capillary-action pump is the limiting factor in heat transport capability. One of the key parameters for capillary pumping is the width of the grooves used to define the projections 41 and resulting wicking surfaces. This parameter is important because it drives the capillary limit to supply cooling fluid to the evaporator chamber 25. The groove width should be carefully chosen to account for sag and layering requirements, as will be appreciated by those of skill in the art. The groove width chosen for the test device (about 4 mils) was selected based upon materials and fabrication issues, including considerations of total substrate thickness. Guidance from the modeling discussed further in the above referenced paper was also used. A curve showing the optimization of heat transport due to the capillary and vapor friction resulting from variation of the groove width may be seen in FIG. 10.

Another key parameter of importance is the heat transport length from the heat source (i.e., electronic device 22) to the evaporator chamber 25. This is important for the effectivity of the cooling substrate 21a to maintain a moderately low temperature on the electronic device 22 requiring the heat dissipation. The electronic device 22 should interface with the evaporator chamber 25 with as little thermal resistivity as possible. As such, it is preferable that any material used underneath the electronic device 22 be vacuum sealable to the LTCC and matched in CTE, as discussed above.

A simplified model may be used to illustrate thermal resistivity of the LTCC cooling substrate 21a with thermal vias 35 for conduction to the evaporator chamber 25. The model includes a thermal path through a substrate of the electronic device 22 and the cooling substrate 21a with thermal vias 35 (each of which has its own thermal resistivity) and terminating in an idealized constant-temperature evaporator chamber.

Based upon this model, while the evaporator may function at around 45° C., the source device temperature may be significantly higher, depending on the materials and geometry, as may be seen in the graph of FIG. 10. The independent variable represents the number of thermal vias 35 in the path directly beneath the electronic device 22. The graph also illustrates that the electronic device 22 temperature cannot be maintained at a constant value versus heat load if there is significant thermal resistivity in the thermal path. Thermal resistivity is particularly important if the goal is to eliminate thermal electric coolers from the system. With an ambient environment, the goal is typically to keep electronic devices operating as close to ambient as possible.

With the above design considerations in mind, the test device was fabricated to include four condenser chambers 26 and four cooling fluid passageways 27 connecting respective condenser chambers to the evaporator chamber 25. Each of the cooling fluid passageways was made 9.5 mm in length, though longer or shorter lengths are possible according to the present invention. Again, a small hole was formed on the top side of the electronic module 20 just over one of the condenser chambers 26 and a copper fill tube was also brazed therein to allow evacuation and filling of the cooling fluid.

The thermal transfer bodies 28, 36 were mounted to allow direct coupling to the respective wicking surfaces 41. The thermal transfer bodies 28, 36 were hermetically brazed to the LTCC cooling substrate 21a using 80/20 gold/tin. An Ultra__FETTm Power metal oxide semiconductor field effect transistor (MOSFET) bare die (0.28 cm) made by the assignee of the present invention was used as the electronic device 22. This MOSFET was solder mounted adjacent the evaporator chamber 25 and wire bonded to a thick film surface metallization forming the base plate 29 to provide electrical interconnect. Wires soldered to the same metallization provided interconnection to an electrical test fixture.

As noted above, the cooling substrate 21a may be LTCC. LTCC is a commercially available low temperature firing glass-ceramic (850° C.) system originally developed for multi-layered circuit fabrication which can accommodate high conductivity metal circuits (such as gold, silver, and copper) and hermetic packaging. Typical properties of the tape noted above include a thermal conductivity between 2 and 3 W/mK and a CTE of 7 ppm/° C. High thermal conductivity thermal transfer bodies 28, 36 with a CTE matched to that of the LTCC were used to seal the heat pipes at the evaporator and condenser chambers 25, 26, and 80/20 Gold/Tin solder was used to provide hermeticity.

In order to test the device, several pieces of test equipment were used including a DC power supply, a custom power control circuit, a thermoelectric cooler, and two 0.003" wire type K thermocouples with temperature meters. The custom power control circuit allowed for independent control of the MOSFET power utilizing feedback circuitry, and the thermoelectric cooler was used to maintain a stable condenser temperature. The thermoelectric cooler was maintained at 20° C. throughout the test to provide a stable condenser chamber 26 temperature which aided measurement taking and calculations. One of the two thermocouples was used to measure the condenser temperature, and the other was placed in contact with the MOSFET surface with the aid of thermal grease which allowed continuous junction temperature monitoring. All tests were conducted horizontally in still air.

Test units fabricated as described above were tested over a range of 10 Watts of heat dissipation. The results may be seen in the graph shown in FIG. 5. The graph illustrates a junction temperature runaway that results when the substrate is passive (i.e., unfilled) (line 46) versus an active operating substrate (line 47). A hystersis reference line 48 is also provided. The thermal heat pipe cycle activated at about 3 Watts and stabilized at about 6 Watts. This range of parameters may be ideal for many electronic devices or other systems requiring reduced power dissipation and reduced circuit complexity. More specifically, the present invention is therefore suitable for use with laser diode arrays, computer central processing unit (CPU) chips, radio frequency (RF) power modules, high density multi-chip modules, optical modules, and phased array antennas, for example.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

That which is claimed is:

1. An electronic module comprising:
   a cooling substrate and an electronic device mounted thereon;
   a heat sink adjacent said cooling substrate;
   said cooling substrate having an evaporator chamber adjacent said electronic device, at least one condenser chamber adjacent said heat sink, and at least one cooling fluid passageway connecting said evaporator chamber in fluid communication with said at least one condenser chamber;
   said cooling substrate comprising projections extending inwardly into said at least one cooling fluid passageway for facilitating cooling fluid flow by capillary action;
   an evaporator thermal transfer body connected in thermal communication between said evaporator chamber and said electronic device; and
   at least one condenser thermal transfer body connected in thermal communication between said at least one condenser chamber and said heat sink;
   said evaporator thermal transfer body and said at least one condenser thermal transfer body each having a higher thermal conductivity than adjacent cooling substrate portions.

2. The electronic module of claim 1 wherein said evaporator thermal transfer body, said at least one condenser thermal transfer body, and said at least one cooling fluid passageway cause fluid flow during operation of the electronic module without a pump.

3. The electronic module of claim 1 wherein said evaporator thermal transfer body comprises a wicking portion exposed within said evaporator chamber for facilitating cooling fluid flow by capillary action.

4. The electronic module of claim 3 wherein said wicking portion comprises a plurality of projections.

5. The electronic module of claim 4 wherein said plurality of projections are arranged in a generally rectangular pattern.

6. The electronic module of claim 3 wherein said evaporator thermal transfer body further comprises a base plate carrying said wicking portion for facilitating sealing with adjacent cooling substrate portions.

7. The electronic module of claim 1 wherein said at least one condenser thermal transfer body comprises at least one wicking portion exposed within said at least one condenser chamber for facilitating cooling fluid flow by capillary action.

8. The electronic module of claim 7 wherein said at least one condenser thermal transfer body comprises a reservoir portion adjacent said at least one wicking portion defining a cooling fluid reservoir.

9. The electronic module of claim 7 wherein said at least one wicking portion comprises at least one base and a plurality of projections extending outwardly therefrom.

10. The electronic module of claim 9 wherein said plurality of projections are arranged in two generally rectangular groups oriented at a substantially right angle.

11. The electronic module of claim 9 wherein each of said projections comprises a reduced width tip portion.

12. The electronic module of claim 7 wherein said at least one condenser thermal transfer body further comprises a base plate carrying said at least one wicking portion for facilitating sealing with adjacent cooling substrate portions.

13. The electronic module of claim 1 wherein said cooling substrate further comprises projections extending inwardly into said evaporator chamber and said at least one condenser chamber for facilitating cooling fluid flow by capillary action.

14. The electronic module of claim 1 wherein each of said evaporator and at least one condenser thermal transfer bodies comprise metal; and wherein said cooling substrate comprises ceramic.

15. The electronic module of claim 1 wherein said evaporator thermal transfer body and said at least one condenser thermal transfer body are resistant to corrosion from the cooling fluid.

16. An electronic module comprising:
a cooling substrate and an electronic device mounted thereon;
a heat sink adjacent said cooling substrate;
said cooling substrate having an evaporator chamber adjacent said electronic device, at least one condenser chamber adjacent said heat sink, and at least one cooling fluid passageway connecting said evaporator chamber in fluid communication with said at least one condenser chamber; and
an evaporator thermal transfer body connected in thermal communication between said evaporator chamber and said electronic device, said evaporator thermal transfer body comprising a wicking portion comprising a plurality of projections exposed within said evaporator chamber for facilitating cooling fluid flow by capillary action;
said evaporator thermal transfer body having a higher thermal conductivity than adjacent cooling substrate portions.

17. The electronic module of claim 16 wherein said plurality of projections are arranged in a generally rectangular pattern.

18. The electronic module of claim 16 wherein said evaporator thermal transfer body further comprises a base plate carrying said wicking portion for facilitating sealing with adjacent cooling substrate portions.

19. The electronic module of claim 16 wherein said evaporator thermal transfer body comprises metal; and wherein said cooling substrate comprises ceramic.

20. An electronic module comprising:
a cooling substrate and an electronic device mounted thereon;
a heat sink adjacent said cooling substrate;
said cooling substrate having an evaporator chamber adjacent said electronic device, at least one condenser chamber adjacent said heat sink, and at least one cooling fluid passageway connecting said evaporator chamber in fluid communication with said at least one condenser chamber; and
at least one condenser thermal transfer body connected in thermal communication between said at least one condenser chamber and said heat sink, said at least one condenser thermal transfer body comprising at least one wicking portion exposed within said at least one condenser chamber for facilitating cooling fluid flow by capillary action, said at least one wicking portion comprising at least one base and a plurality of projections extending outwardly therefrom;
said at least one condenser thermal transfer body having a higher thermal conductivity than adjacent cooling substrate portions.

21. The electronic module of claim 20 wherein said at least one condenser thermal transfer body comprises a reservoir portion adjacent said at least one wicking portion defining a cooling fluid reservoir.

22. The electronic module of claim 20 wherein said plurality of projections are arranged in two generally rectangular groups oriented at a substantially right angle.

23. The electronic module of claim 20 wherein each of said projections comprises a reduced width tip portion.

24. The electronic module of claim 20 wherein said at least one condenser thermal transfer body further comprises a base plate carrying said at least one wicking portion for facilitating sealing with adjacent cooling substrate portions.

25. The electronic module of claim 20 wherein said at least one condenser thermal transfer body comprises metal; and wherein said cooling substrate comprises ceramic.

26. An electronic module comprising:
a cooling substrate and an electronic device mounted thereon;
a heat sink adjacent said cooling substrate;
said cooling substrate having an evaporator chamber adjacent said electronic device, at least one condenser chamber adjacent said heat sink, and at least one cooling fluid passageway connecting said evaporator chamber in fluid communication with said at least one condenser chamber, said cooling substrate comprising projections extending inwardly into said at least one cooling fluid passageway for facilitating cooling fluid flow by capillary action; and
an evaporator thermal transfer body connected in thermal communication between said evaporator chamber and said electronic device;
said evaporator thermal transfer body having a thermal conductivity of greater than about 100 Watts per meter-degree Celsius.

27. The electronic module of claim 26 wherein said evaporator thermal transfer body comprises a wicking portion exposed within said evaporator chamber for facilitating cooling fluid flow by capillary action.

28. The electronic module of claim 27 wherein said evaporator thermal transfer body further comprises a base plate carrying said wicking portion for facilitating sealing with adjacent cooling substrate portions.

29. An electronic module comprising:
a cooling substrate and an electronic device mounted thereon;
a heat sink adjacent said cooling substrate;
said cooling substrate having an evaporator chamber adjacent said electronic device, at least one condenser chamber adjacent said heat sink, and at least one cooling fluid passageway connecting said evaporator chamber in fluid communication with said at least one condenser chamber, said cooling substrate comprising projections extending inwardly into said at least one cooling fluid passageway for facilitating cooling fluid flow by capillary action; and
at least one condenser thermal transfer body connected in thermal communication between said at least one condenser chamber and said heat sink;
said at least one condenser thermal transfer body having a thermal conductivity of greater than about 100 Watts per meter-degree Celsius.

30. The electronic module of claim 29 wherein said at least one condenser thermal transfer body comprises at least one wicking portion exposed within said at least one condenser chamber for facilitating cooling fluid flow by capillary action.

31. The electronic module of claim 30 wherein said at least one condenser thermal transfer body further comprises a base plate carrying said at least one wicking portion for facilitating sealing with adjacent cooling substrate portions.

32. A method for making an electronic module comprising:
forming a cooling substrate having an evaporator chamber, at least one condenser chamber, and at least one cooling fluid passageway connecting the evaporator chamber in fluid communication with the at least one condenser chamber;
mounting an electronic device on the cooling substrate adjacent the electronic device;
connecting an evaporator thermal transfer body in thermal communication between the evaporator chamber and the electronic device, the evaporator thermal transfer body having a higher thermal conductivity than adjacent cooling substrate portions, the evaporator thermal transfer body comprising a wicking portion comprising a plurality of projections exposed within the evaporator chamber for facilitating cooling fluid flow by capillary action; and
connecting a heat sink to the cooling substrate adjacent the at least one condenser chamber.

33. The method of claim 32 wherein the plurality of projections are arranged in a generally rectangular pattern.

34. The method of claim 32 wherein the evaporator thermal transfer body further comprises a base plate carrying the wicking portion for facilitating sealing with adjacent cooling substrate portions.

35. The method of claim 32 wherein the evaporator thermal transfer body comprises metal; and wherein the cooling substrate comprises ceramic.

36. A method for making an electronic module comprising:
forming a cooling substrate having an evaporator chamber, at least one condenser chamber, and at least one cooling fluid passageway connecting the evaporator chamber in fluid communication with the at least one condenser chamber;
mounting an electronic device on the cooling substrate adjacent the evaporator chamber;
connecting at least one condenser thermal transfer body in thermal communication between the at least one condenser chamber, the at least one condenser thermal transfer body having a higher thermal conductivity than adjacent cooling substrate portions and comprising at least one wicking portion exposed within the at least one condenser chamber for facilitating cooling fluid flow by capillary action, the at least one wicking portion comprising at least one base and a plurality of projections extending outwardly therefrom; and
connecting a heat sink to the cooling substrate adjacent the at least one condenser chamber.

37. The method of claim 36 wherein the at least one condenser thermal transfer body comprises a reservoir portion adjacent the at least one wicking portion defining a cooling fluid reservoir.

38. The method of claim 36 wherein the plurality of projections are arranged in two generally rectangular groups oriented at a substantially right angle.

39. The method of claim 36 wherein each of the projections comprises a reduced width tip portion.

40. The method of claim 36 wherein the at least one condenser thermal transfer body further comprises a base plate carrying the at least one wicking portion for facilitating sealing with adjacent cooling substrate portions.

41. The method of claim 36 wherein the at least one condenser thermal transfer body comprises metal; and wherein the cooling substrate comprises ceramic.

42. An electronic module comprising:
a cooling substrate and an electronic device mounted thereon;
a heat sink adjacent said cooling substrate;
said cooling substrate having an evaporator chamber adjacent said electronic device, a plurality of spaced apart condenser chambers adjacent said heat sink, and respective cooling fluid passageways connecting said evaporator chamber in fluid communication with said spaced apart condenser chambers;
an evaporator thermal transfer body connected in thermal communication between said evaporator chamber and said electronic device; and
a respective condenser thermal transfer body connected in thermal communication between each condenser chamber and said heat sink;
said evaporator thermal transfer body and said condenser thermal transfer bodies each having a higher thermal conductivity than adjacent cooling substrate portions.

43. The electronic module of claim 42 wherein said evaporator thermal transfer body comprises a wicking portion exposed within said evaporator chamber for facilitating cooling fluid flow by capillary action.

44. The electronic module of claim 43 wherein said wicking portion comprises a plurality of projections.

45. The electronic module of claim 42 wherein each condenser thermal transfer body comprises at least one wicking portion exposed within its respective condenser chamber for facilitating cooling fluid flow by capillary action.

46. The electronic module of claim 45 wherein said at least one wicking portion comprises at least one base and a plurality of projections extending outwardly therefrom.

47. The electronic module of claim 41 wherein said cooling substrate further comprises projections extending inwardly into said cooling fluid passageways for facilitating cooling fluid flow by capillary action.

\* \* \* \* \*